United States Patent [19]

Stoppels et al.

[11] Patent Number: 4,568,993
[45] Date of Patent: Feb. 4, 1986

[54] MAGNETIC HEAD

[75] Inventors: Doeko Stoppels; Piet F. Bongers; Johannes P. M. Damen; Eelco G. Visser, all of Eindhoven, Netherlands

[73] Assignee: U.S. Philips Corporation, New York, N.Y.

[21] Appl. No.: 460,413

[22] Filed: Jan. 24, 1983

[30] Foreign Application Priority Data

Feb. 9, 1982 [NL] Netherlands ............... 8200480

[51] Int. Cl.$^4$ ............................... G11B 7/12
[52] U.S. Cl. ....................... 360/125; 252/62.62;
427/128; 428/336; 428/694; 428/900
[58] Field of Search ............ 428/694, 900, 336;
252/62.62; 360/125; 360/120; 427/128

[56] References Cited

U.S. PATENT DOCUMENTS

| | | | |
|---|---|---|---|
| 2,636,860 | 4/1953 | Smock | 252/62.62 |
| 2,886,529 | 5/1959 | Guillaud | 252/62.62 |
| 3,145,452 | 8/1964 | Cauras | 360/125 |
| 3,605,258 | 9/1971 | Fisher | 204/192 M |

FOREIGN PATENT DOCUMENTS 1300859 8/1969 Fed. Rep. of Germany ... 252/62.62
28076 . 7/1974 Japan .

OTHER PUBLICATIONS

D. König, "Improved Manganese-Zinc Ferrites for Power Transformers," *IEEE Trans. on Magnetico*, vol. Mag. 11 (No. 5), pp. 1306–1308, 1975.

*Primary Examiner*—Ellis P. Robinson
*Attorney, Agent, or Firm*—Joseph P. Abate

[57] ABSTRACT

Magnetic head for a magnetic recording and playback apparatus includes a core of a Mn—Zn-ferrous ferrite having a very high saturation magnetization. The Mn—Zn-ferrous ferrite has a composition (not counting optional substitutions) according to the formula $$Mn_a Zn_b Fe_c^{II} Fe_e^{III} O_4$$

with $$0 < a \leq 0.55$$

$$0.06 \leq b \leq 0.4$$

$$0.25 \leq c \leq 0.9$$

$$(a + b + c = 1).$$

The result is that the magnetic head may be used in combination with magnetic tapes having a very high coercive force (up to 104 kA/m (1300 Oersted) and may be used for transducing signals having a frequency of a few MHz.

4 Claims, 3 Drawing Figures

MAGNETIC HEAD

BACKGROUND OF THE INVENTION

The invention relates to a magnetic head for a magnetic recording and playback apparatus, which head comprises a Mn—Zn-ferrite core having two core parts between which a transducing gap is formed.

It is known tht the use of ferrites, in particular monocrystalline Mn—Zn-ferrites, as magnetic core materials of magnetic heads is desired for use in apparatus for magnetic tape recording and playback, for example, in audio and video tape recorders. This desirability is because ferrites are available which have the advantage of high resistance to detrition and very good magnetic properties, for example, with respect to magnetic saturation, coercive force and permeability, and good frequency characteristics.

The strength of the magnetic fields which are generated at the area of the transducing gap by a magnetic head to write information on a magnetic medium depend directly on the saturation magnetization of the material of the core of the magnetic head. Magnetic heads for present-day video recorders usually have a core of a Mn—Zn-ferrite. This type of material has a saturation magnetization $4\pi M_s$ of approximately 500 mT (5000 Gauss) at room temperature. The magnetization of these MnZn ferrites at temperatures which are slightly above room temperature satisfies the requirements which are imposed upon writing of information on conventional tapes, such as $CrO_2$ tape having a coercive force $H_c$ of approximately 56 $kA^2/m$ (700 Oersted).

However, in order to improve the quality of the video recording process, there is the tendency to replace the conventional magnetic tapes by magnetic tapes having a high coercive force, such as tapes on the basis of pure Fe which have a $H_c$ of approximately 88–136 kA/m (1100-1700 Oersted). The use of such magnetic tapes requires the materials of the magnetic core to have a larger value of the saturation magnetization ($4\pi M_s$) than the presentday ferrite materials. Such as material does exist but it has other properties which differ from the properties of these ferrite materials which make it less suitable for the applications in view. This material, Sendust, an alloy of approximately 85% by weight Fe, 10% by weight Si and 5% by weight Al, has a saturation magnetization $4\pi M_s$ which is considerably higher than 500 mT. However, it has a resistivity of $10^{-6} \Omega$ m which is three orders of magnitude smaller than the resistivity of monocrystalline Mn—Zn-ferrites. Because of this low resistivity, the core of a video Sendust head must be constructed from a number of electrically insulated laminations. Moreover, Sendust is less resistant to detrition than ferrites.

SUMMARY OF THE INVENTION

It is an object of the invention to provide a core for a magnetic head which includes of a material which combines a resistance to detrition which is comparable to the resistance to detrition of ferrites with a saturation magnetization which is appreciably higher than 500 mT (5000 Gauss) and preferably with a magnetic permeability which makes the core suitable for use in magnetic heads which are also used for reading operations.

This object is achieved in that the magnetic head according to the invention has a core of a manganese-zinc -ferrous ferrite of the composition $Mn_aZn_bFe_c^{II}Fe_2^{III}O_4$ with $0 < a \leq 0.55$; $0.06 < b \leq 0.4$ and $0.25 \leq c \leq 0.9$ ($a+b+c=1$). Ferrites of these compositions having a considerably higher ferrous content than the Mn—Zn ferrites which are usual so far for video heads (where c is between 0.4 and 0.08) appear to have high values of the saturation magnetization. The highest values of the saturation magnetization are found in the range of compositions with $C \geq 0.55$, with a maximum (at 20° C.) of approximately 690 mT. With this latter value, consequently, the value of 500 mT for the Mn—Zn ferrite used nowadays is improved by approximately 38%. Recording information on magnetic tapes with a coercive force of up to 104 kA/m seems quite possible with magnetic heads having cores of this material. Cores which are also suitable for use in magnetic heads which are used for reading operations preferably have a composition in the range of compositions characterized by $0.2 \leq a \leq 0.5$, $0.1 \leq b \leq 0.40$, $0.25 \leq c \leq 0.40$, In this range, the most attractive combination of saturation magnetization and permeability is found in the temperature range from 20°–40° C.

The resistivity of the monocrystalline material is approximately $4 \times 10^{-4} \Omega$ m ($4 \times 10^{-2} \Omega$ cm) which is approximately two orders of magnitude higher than the resistivity of sendust. Although the electric conductivity thus is considerably lower than that of Sendust, it is still so large that, as a result of the occurrence of the skin-effect it might restrict the applicability of the present Mn—Zn-ferrous ferrites with increased ferrous content for magnetic heads which are to write signals of video frequencies. It has been found, however, that with the dimensions of video heads as they are nowadays, this comparatively high conductivity does not present any problems for the transducing of signals having a frequency up to even 4.5 MHz (video frequency) when the (unlaminated) head cores are not thicker than 200 μm.

A Mn—Zn-ferrous ferrite single crystal is preferably used for the head core of the magnetic head according to the invention.

Single crystals of this material can be grown comparatively easily by means of the so-called "seeded" Bridgman method. This is a modified Bridgman method in which a seed crystal is used.

BRIEF DESCRIPTION OF THE DRAWINGS

An embodiment of the invention will now be described in greater detail by way of example, with reference to the drawing, in which.

DESCRIPTION OF THE PREFERRED EMBODIMENTS

Figure 1:
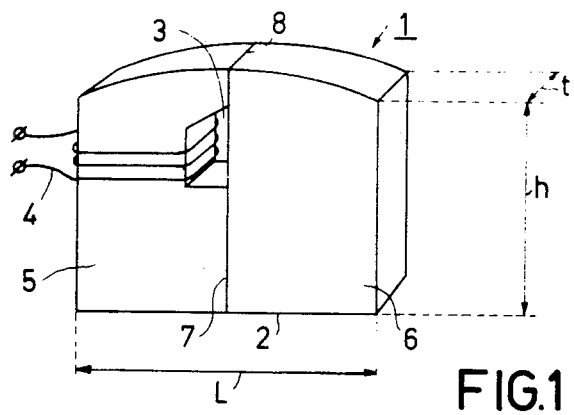
FIG. 1 is a diagrammatic perspective view of a magnetic head.

FIG. 1 shows a magnetic head 1 having a magnetic core 2. The magnet core 2 has a winding aperture 3 through which a winding 4 is wound. The magnet core 2 is formed from two monocrystalline wafers 5, 6 of Mn—Zn-ferrous ferrite which are bonded together by means of glass in the places 7, 8.

In magnet cores in accordance with the invention with $0 < a \leq 0.55$; $0.06 < b \leq 0.4$ and $0.25 < c \leq 0.9$ in the formula $Mn_aZn_bFe_2^{II}Fe_2^{III}O_4$, the saturation magnetization $4\pi M_s$ increases from approximately 600 mT ($c = 0.25$) and 620 mT ($c = 0.3$), respectively, to approximately 690 mT. The highest values are found in range C of FIG. 2. All $4\pi M_s$ values were measured by means of a vibrating sample magnetometer.

The most attractive combination of saturation magnetization and permeability (in the temperature range from 20°-40° C.) was found in the range of compositions with $$0.2 \leq a \leq 0.5,$$

$$0.1 \leq b \leq 0.40,$$

$$0.25 \leq c \leq 0.40.$$

Figure 2:
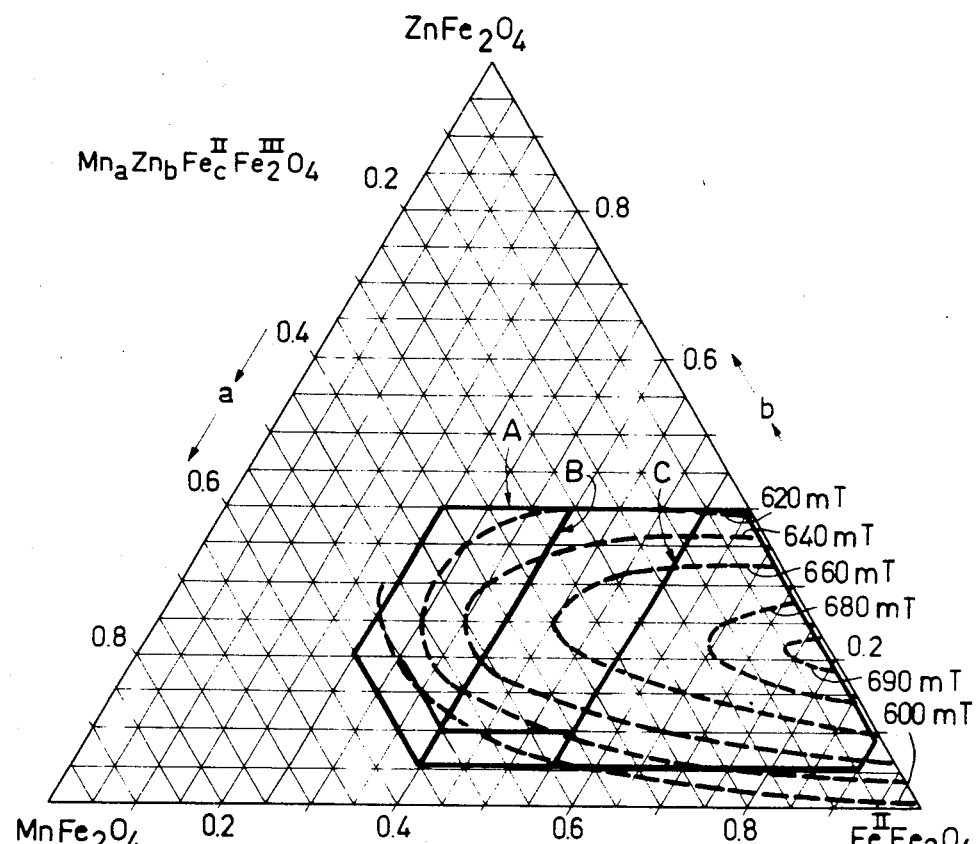
FIG. 2 shows a composition diagram of Mn—Zn-ferrous ferrites having indicated therein the range to which the present invention relates and the measured $4\pi M_s$ values at 20° C.

This range is indicated by B in FIG. 2. (The total composition range to which the invention relates is indicated by A).

A representative from the composition range B indicated by the invention is

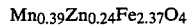

$$Mn_{0.39}Zn_{0.24}Fe_{2.37}O_4$$

which in the temperature range of 20°-40° C. which is important for video recording, has a magnetic permeability $\mu$ of from 450 (20° C.) to 600 (40° C.) at 0.5 mHz.

Figure 3:
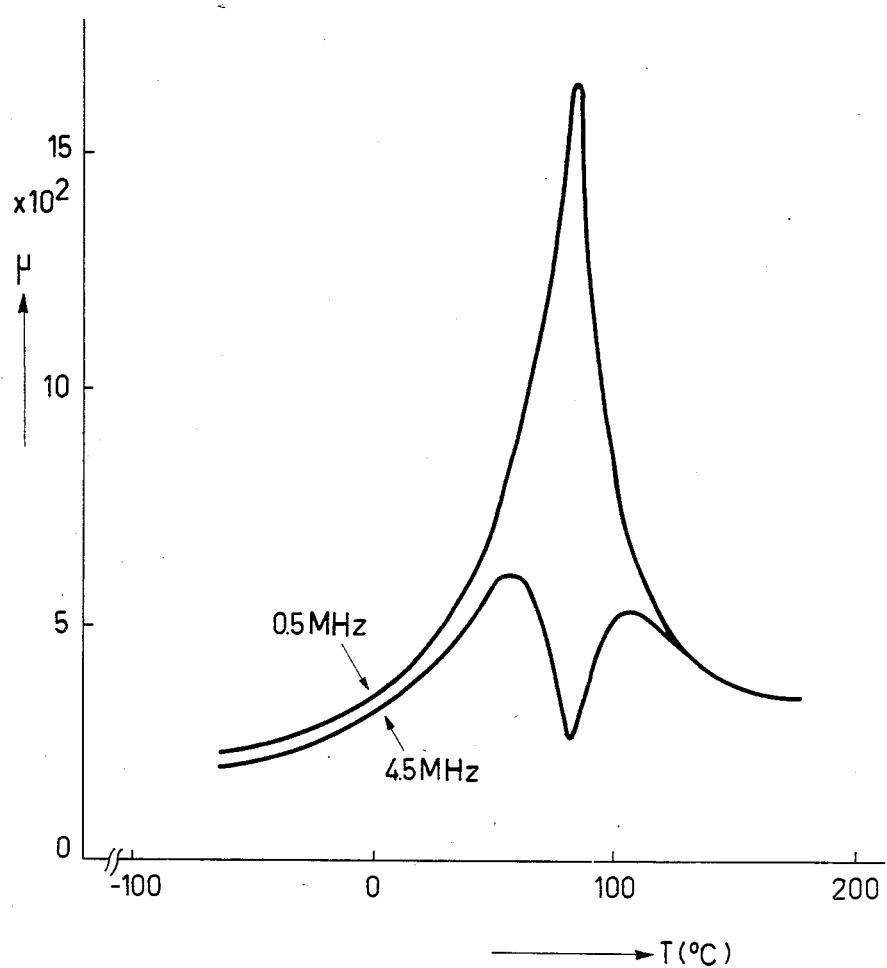
FIG. 3 is a graph showing the (real component of the) magnetic permeability of a substantially stress-free annular core of the composition $Mn_{0.39}Zn_{0.24}Fe_{2.37}O_4$ as a function of the temperature T in °C.

FIG. 3 shows the permeability $\mu$ of an annular core of the above-mentioned composition as a function of the temperature T in °C., measured at a frequency of 0.5 MHz and a frequency of 4.5 MHz.

It will be obvious from the above that (monocrystalline) Mn—Zn-ferrous ferrite with increased ferrous content is a very suitable material for magnetic heads which are used in combination with high coercive magnetic tapes such as metal powder tape ($Hc \geq 90$ kA/m) or vapor deposited metal tape ($H_c \approx 64$ kA/m.) When used in combination with magnetic tapes with a coercive force ($H_c \approx 30$ kA/m) usual so far, the advantage is that the intermodulation distortion and the signal strength improve.

Characteristic dimensions for the magnetic head 1 of FIG. 1 are L=3 mm and h=3 mm. With a thickness dimension t of 200 μm or smaller, a magnetic head of monocrystalline Mn—Zn-ferrous ferrite with increased ferrous content could be operated at frequencies of a few MHz without being troubled by the skin-effect inspite of a comparatively low resistivity. The resistivity of a monocrystalline $Mn_{0.37}Zn_{0.27}Fe_{2.36}O_4$ sample measured by means of the four-point-method at 20° C. was $4 \times 10^{-4} \Omega$ m which is still two orders of magnitude higher than the resistivity of Sendust.

Single crystals of Mn—Zn-ferrite with an increased ferrous content were grown at a temperature of 1625° C. by means of the "seeded" Bridgman method in a platinum crucible in an oxygen atmosphere. The direction of growth was [100]. the rate of growth was approximately 4 mm/h. During cooling, nitrogen was added to the atmosphere, the addition of nitrogen being increased according as the temperature decreased.

Single crystals were obtained having a length of 5 cm and a diameter of 2 cm.

It is to be noted that whereas compositions are found in the range B of the composition diagram of FIG. 2 having properties as regards saturation magneization and magnetic permeability which make cores of materials of this composition suitable for use in writing/reading heads, the compositions in range C are particularly suitable for cores for writing heads due to their extra high saturation magnetization. The values of the magnetic permeability in range C which are lower in themselves can be increased, if so desired, by means of small substitution of certain metal ions, for example, tin ions. A further interesting aspect of the compositions in range C of FIG. 2 is that cores manufactured therefrom show comparatively large magnetostriction constants ($\lambda_{111} \approx 40 \times 10^{-6}$; $\lambda 100 \approx -10 \times 10^{-6}$). This can be used positively when the performance of the magnetic head is to be improved.

What is claimed is:

1. A magnetic head suitable for a magnetic recording and playback apparatus, the head comprising a core having two magnetic core parts which form a transducing gap therebetween, characterized in that the magnetic core parts consist essentially of a monocrystalline Mn—Zn-ferrous ferrite having a composition

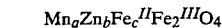

$$Mn_aZn_bFe_c^{II}Fe_2^{III}O_4$$

wherein:

$$0 < a \leq 0.55,$$

$$0.06 < b \leq 0.4,$$

$$0.25 < c \leq 0.9,$$

($a + b + c = 1$); and in that the core has a thickness of not greater than 200 micrometers.

2. A magnetic head as claimed in claim 1, characterized in that $0.3 \leq c \leq 0.9$.

3. A magnetic head as claimed in claim 1, characterized in that $0 < a \leq 0.39$ and $0.55 \leq c \leq 0.9$.

4. A magnetic head as claimed in claim 1 or 2, characterized in that $0.2 \leq a \leq 0.5$; $0.1 \leq b \leq 0.40$; $0.25 \leq c \leq 0.40$.

* * * * *